United States Patent [19]

Hansen et al.

[11] Patent Number: 6,136,724
[45] Date of Patent: Oct. 24, 2000

[54] MULTIPLE STAGE WET PROCESSING CHAMBER

[75] Inventors: Eric T. Hansen; William Warren Becia; Thomas Wayne Ives; Victor B. Mimken, all of Boise; Randy Mark Hall, Meridian; Tom Krawzak, Boise, all of Id.

[73] Assignee: SCP Global Technologies, Boise, Id.

[21] Appl. No.: 09/025,612

[22] Filed: Feb. 18, 1998

Related U.S. Application Data

[60] Provisional application No. 60/038,840, Feb. 18, 1997.

[51] Int. Cl.⁷ .................................................. H01L 21/302
[52] U.S. Cl. .............................. 438/745; 438/748; 134/25
[58] Field of Search ............................... 156/345; 134/25, 134/26, 2, 21, 902; 438/745, 748, 753, 756

[56] References Cited

U.S. PATENT DOCUMENTS

| | | |
|---|---|---|
| 61,571 | 1/1867 | Searle . |
| 2,706,992 | 4/1955 | Friedman et al. ................ 134/140 |
| 2,959,151 | 11/1960 | Ehrlich .................... 118/429 |
| 2,961,354 | 11/1960 | Cleveland .................. 134/1 |
| 3,208,157 | 9/1965 | Stark ...................... 34/74 |
| 3,276,458 | 10/1966 | Iverson et al. ............... 134/57 |
| 3,343,812 | 9/1967 | Moulton .................... 259/2 |
| 3,392,780 | 7/1968 | Brown ..................... 118/129 |
| 3,443,991 | 5/1969 | Kremm .................... 134/2 |
| 3,595,252 | 7/1971 | Conte ..................... 134/109 |
| 3,746,022 | 7/1973 | Fillion et al. .............. 134/141 |
| 3,760,822 | 9/1973 | Evans ..................... 134/99 |
| 3,813,311 | 5/1974 | Beck et al. ................ 156/17 |
| 3,870,033 | 3/1975 | Faylor et al. .............. 126/360 |
| 3,871,914 | 3/1975 | Goffredo et al. ............ 134/109 |
| 4,015,615 | 4/1977 | Weber et al. ............... 134/196 |
| 4,039,357 | 8/1977 | Bachmann et al. ........... 148/175 |
| 4,077,416 | 3/1978 | Johnson, Jr. et al. ........ 134/159 |
| 4,098,005 | 7/1978 | Wiards ..................... 34/73 |
| 4,111,715 | 9/1978 | Sprengling et al. .......... 134/10 |
| 4,132,567 | 1/1979 | Blackwood ................. 134/1 |
| 4,159,917 | 7/1979 | Gluck ..................... 148/1.5 |
| 4,197,000 | 4/1980 | Blackwood ................. 354/323 |

(List continued on next page.)

FOREIGN PATENT DOCUMENTS

| | | |
|---|---|---|
| 1282 363 | 7/1972 | United Kingdom . |
| 1298 006 | 11/1972 | United Kingdom . |
| 1308 790 | 3/1973 | United Kingdom . |
| 1385 730 | 2/1975 | United Kingdom . |

OTHER PUBLICATIONS

Chemineer, Inc. Article "Kenics Static Mixers" 1982.

Semiconductor International, "Cleaning Techniques for Wafer Surfaces", Aug. 1987.

*Primary Examiner*—Benjamin L. Utech
*Assistant Examiner*—Kin-Chan Chen
*Attorney, Agent, or Firm*—Limbach & Limbach L.L.P.

[57] ABSTRACT

An apparatus and method for performing multiple wet processing steps on objects placed within a sealed chamber. The apparatus include a sealable chamber, at least one processing tank within the chamber, and preferably also includes an intrachamber robot configured to move objects to be treated within the chamber. Preferred embodiments utilize at least two processing tanks within the chamber. During use of these exemplary embodiments, objects to be treated are placed within the sealed chamber and the chamber is sealed to create a sealed interior environment. The objects are immersed in a first treatment fluid which is in a first one of the tanks, and then carried by the intrachamber robot from the first to the second tank where there are immersed in a second treatment fluid in the second tank. The objects may be moved back and forth between the tanks as needed in order to complete the process being performed. After processing is complete, the chamber is unsealed and the objects are removed from the chamber. In a preferred method, processing fluids are drained from the tanks at some point prior to the unsealing of the chamber in order to substantially prevent passage of fumes to the outside environment or contaminants from the exterior environment.

23 Claims, 9 Drawing Sheets

U.S. PATENT DOCUMENTS

| | | | |
|---|---|---|---|
| 4,282,825 | 8/1981 | Nagatomo et al. | 118/58 |
| 4,286,541 | 9/1981 | Blackwood | 118/52 |
| 4,328,081 | 5/1982 | Fazlin | 204/192 |
| 4,358,470 | 11/1982 | Rasmussen | 427/4 |
| 4,383,884 | 5/1983 | Rozmus | 156/642 |
| 4,389,797 | 6/1983 | Spigarelli et al. | 34/73 |
| 4,426,246 | 1/1984 | Kravitz et al. | 156/643 |
| 4,479,849 | 10/1984 | Frantzen | 156/640 |
| 4,519,846 | 5/1985 | Aigo | 134/15 |
| 4,520,834 | 6/1985 | DiCicco | 134/63 |
| 4,555,216 | 11/1985 | Buschor | 414/728 |
| 4,577,650 | 3/1986 | McConnell | 134/95 |
| 4,589,926 | 5/1986 | Holmstrand | 134/6 |
| 4,633,893 | 1/1987 | McConnell et al. | 134/95 |
| 4,658,513 | 4/1987 | Strattman | 34/78 |
| 4,736,758 | 4/1988 | Kusuhara | 134/68 |
| 4,777,970 | 10/1988 | Kusuhara | 134/66 |
| 4,778,532 | 10/1988 | McConnell et al. | 134/10 |
| 4,841,645 | 6/1989 | Bettcher et al. | 34/78 |
| 4,868,996 | 9/1989 | Ohmori et al. | 34/13 |
| 4,899,768 | 2/1990 | Yatabe | 134/66 |
| 4,977,688 | 12/1990 | Roberson, Jr. et al. | 34/92 |
| 4,982,512 | 1/1991 | McClenny | 34/77 |
| 5,052,126 | 10/1991 | Moe et al. | 34/78 |
| 5,054,210 | 10/1991 | Schumacher et al. | 34/74 |
| 5,089,084 | 2/1992 | Chhabra et al. | 156/646 |
| 5,092,011 | 3/1992 | Gommori et al. | 15/88.2 |
| 5,188,136 | 2/1993 | Kumagai | 134/66 |
| 5,226,242 | 7/1993 | Schwenkler | 134/78 |
| 5,227,001 | 7/1993 | Tamaki et al. | 156/345 |
| 5,265,632 | 11/1993 | Nishi | 134/133 |
| 5,383,482 | 1/1995 | Yamada et al. | 134/66 |
| 5,464,480 | 11/1995 | Matthews | 134/1.3 |
| 5,551,459 | 9/1996 | Ohmori et al. | 134/61 |
| 5,571,337 | 11/1996 | Mohindra et al. | 134/25.4 |
| 5,902,402 | 5/1999 | Durst et al. | 118/423 |
| 5,951,779 | 9/1999 | Koyanagi et al. | 134/2 |

MULTIPLE STAGE WET PROCESSING CHAMBER

This application claims the benefit of U.S. Provisional application No. 60/038,840 filed Feb. 18, 1997, which is incorporated herein by reference.

FIELD OF THE INVENTION

This invention relates to the cleaning of semiconductor substrates, flat panel displays, or other items which require an extremely high level of cleanliness.

BACKGROUND OF THE INVENTION

In the fabrication of semiconductor wafers, there is a multitude of cleaning steps required to remove impurities from the surface of the wafer prior to subsequent processing. The cleaning of a wafer, known as surface preparation, has for years been performed by collecting multiple wafers into a batch and sequentially placing this batch of wafers through a sequence of chemical and rinse steps with the final step being a drying step. Currently, there are several methods used to perform this surface preparation process.

The method that is most prevalent in conventional cleaning applications is the immersion wet cleaning platform, or "wet bench". In this process, a batch of wafers is dipped into a series of tanks, where certain tanks contain chemicals that are needed for clean or etch functions, while others contain deionized water for the rinsing of these chemicals from the wafer surface. Megasonic energy may be imparted to the wafers using piezoelectric transducers coupled to one or more of the cleaning tanks in order to more thoroughly clean the wafer surfaces. The final tank is a dryer for the removal of deionized water from the wafer surface. The number of tanks determines what surface preparation processes are available and how many batches of wafers can be processed within the wet bench system at any one time.

One shortcoming of conventional wet benches is that the tanks, and thus the chemicals inside, are exposed to the environment. This allows fumes from the tanks and from wafers being lifted from the tanks to migrate to the environment surrounding the tanks, where they may pose environmental hazards. Safety lids have been added to some wet bench tanks in order to individually isolate each tank from the environment. However these lids have reduced the flexibility of these systems as well as the wafer throughput, and they do not entirely eliminate migration of fumes from wafers as the wafers are moved between the tanks. Wet bench systems also typically have large footprint requirements and thus increase cost of ownership by requiring extensive space in the fabrication facility.

A second method is single chamber cleaning, as disclosed in U.S. Pat. No. 4,911,761. During this process, a batch of wafers is placed into a single closed vessel. Process fluids flow sequentially through the vessel. This concept has been termed "plug flow" and requires the chemical reagent "plug" to be followed by a plug of rinse fluid (e.g., deionized water (DI) or isopropyl alcohol (IPA)) for each chemical treatment. During cleaning steps utilizing the plug flow method, megasonic energy may be imparted to the wafers using piezoelectric transducers positioned to direct megasonic energy into fluids in the tank.

Although the closed vessel utilized in this method is advantageous in that it has a relatively small footprint and it minimizes migration of fumes to the surrounding environment, the plug flow method has a number of drawbacks. For example, etch performance in a plug flow system relies primarily on complex fluid dynamics within the vessel. These systems also require high chemical use, because the necessary chemical reagents can only be used for a single wafer batch and cannot be recirculated and filtered. Additionally, the plug flow method requires rinsing of chemical reagent from the wafer and chamber surfaces, as compared to the need only to rinse the wafer and cassette surface areas present using conventional cleaning methods. Drying performance using the plug flow method may also be comprised due to the absorption of chemical contaminates into the plastic vessel and the subsequent leaching of these contaminates out of the plastic vessel during the drying steps.

A third cleaning technology is the spray processor or "acid processor" technique. A spray processor includes a carousel which carries batches of wafers and which spins within a chamber. Spray nozzles are oriented around the carousel and direct chemicals onto the wafers. This process relies on centrifugal effects to treat and dry the wafers. One limitation of the spray processor technology is that sonic energy cannot be imparted through the spray onto the wafers; therefore, particle removal is achieved only through etching and centrifugal forces imparted to the particles on the surface of the wafer. Moreover, chemicals used in this process cannot be recirculated and reused, resulting in high chemical use. Finally, the method's reliance on centrifugal forces, leads to frequent to water spotting on the wafers, and the moving parts of the carousel can lead to particle generation and build-up of electrostatic charge, all of which can result in wafer contamination or damage.

It is therefore desirable to have a new surface preparation apparatus and method which occupies a relatively small amount of fabrication facility space by having a small footprint, which substantially prevents fume migration to the environment surrounding the apparatus, and which allows reuse of processing chemicals all while optimizing the level of cleanliness achieved with the apparatus and method.

SUMMARY OF THE INVENTION

The present invention is an apparatus and method for performing multiple wet processing steps on objects placed within a sealed chamber. The apparatus include a sealable chamber, at least one processing tank within the chamber, and preferably also includes an intrachamber robot configured to move objects to be treated within the chamber.

Described herein are embodiments which utilize at least two processing tanks within the chamber. During use of these exemplary embodiments, objects to be treated are placed within the sealed chamber and the chamber is sealed to create a sealed interior environment. The objects are immersed in a first treatment fluid which is in a first one of the tanks, and then carried by the intrachamber robot from the first to the second tank where there are immersed in a second treatment fluid in the second tank. The objects may be moved back and forth between the tanks as needed in order to complete the process being performed. After processing is complete, the chamber is unsealed and the objects are removed from the chamber. In a preferred method, processing fluids are drained from the tanks at some point prior to the unsealing of the chamber in order to substantially prevent passage of fumes to the outside environment or contaminants from the exterior environment.

DETAILED DESCRIPTION

Generally speaking, the present invention is a multiple stage processing chamber for treating wafers, flat panels or other objects or materials requiring exposure to chemicals. The chamber of the present invention is suitable for treatment processes requiring chemicals that are sufficiently compatible to be utilized within a single processing chamber. For simplicity in describing the system and process, the terms "wafer" and "cassette" will be used but are not intended to limit the scope of the invention to wafer processing.

Embodiments are described herein which, while useful for many processes, are particularly well suited for processes requiring three basic stages. The first stage is one in which material to be processed is exposed to reactive solutions. The second stage is a primary or "course" deionized water rinse where the reaction initiated in Stage 1 is attenuated. The third stage is a final residue removal or "fine rinse" step.

As will be detailed below, during a process utilizing the chambers of the described embodiments, each stage may be repeated one or more times if multiple chemical treatment steps are required for the particular process being carried out.

First Embodiment—Structure

Figure 1:
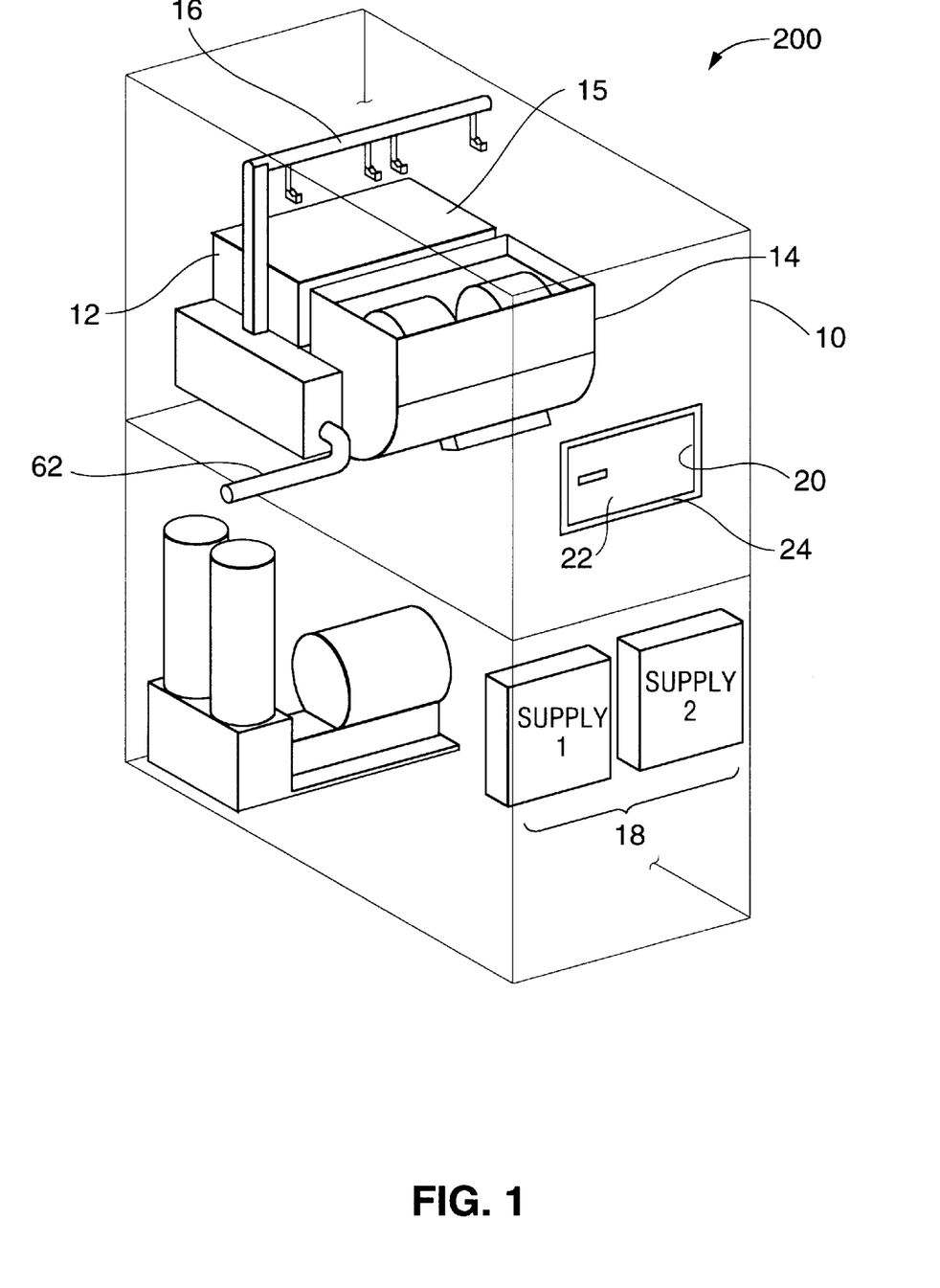
FIG. 1 is a perspective view of a multiple stage wet processing chamber according to the present invention. For clarity, the chamber is shown as being transparent to allow the components within the chamber to be easily seen.

Referring to FIG. 1, a multiple stage wet processing chamber 200 according to the present invention is comprised generally of a sealed chamber 10, a pair of processing tanks 12, 14 enclosed within the chamber 10, and an intrachamber robot 16. Chemical supply tanks 18 are also provided for supplying processing chemicals to the tanks 12, 14.

The chamber 10 and tanks 12, 14 are proportioned so as to require a minimum amount of space within the fabrication facility. Thus, if the system is to be used for wafer processing, tanks 12, 14 might be sized to allow 1–3 cassettes having capacity for 26–104 200–300 mm wafers or flat panels to be immersed within each tank, while allowing only sufficient room around the wafers to promote the proper fluid dynamics needed to optimize processing effectiveness. The chamber 10 is preferably sized to allow only enough space in the chamber interior to accommodate the tanks 12, 14 and the robotics 16.

The sealed chamber 10 is formed a material which is highly resistant to a broad variety of chemicals. Naturally, the material will depend on the chemicals intended to be used within the chamber. For example, plastics such as PVDF, PFA or other high purity plastics may be used for certain applications, while electropolished stainless steel may be used for others including those requiring solvents. An opening 20 is provided in the chamber 10 through which objects to be cleaned, such as wafers, may be brought into and removed from the chamber. The opening 20 includes a door 22 which opens and closes to allow access to the chamber interior. When the door is closed, air tight gasket seals 24 surrounding the door 22 create a substantially leak proof seal which substantially prevents fumes released within the chamber 10 from escaping to the outside environment.

Figure 2A:
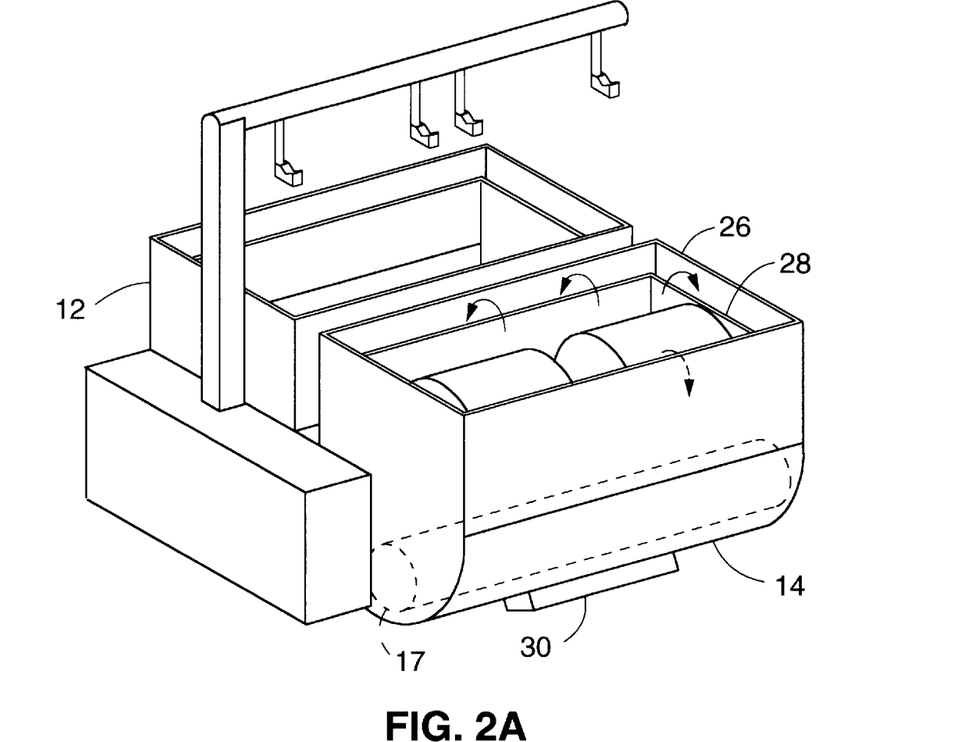
FIG. 2A is a perspective view of the chemical tanks and the intrachamber robot of the multiple stage wet processing chamber of FIG. 1.
Figure 2B:
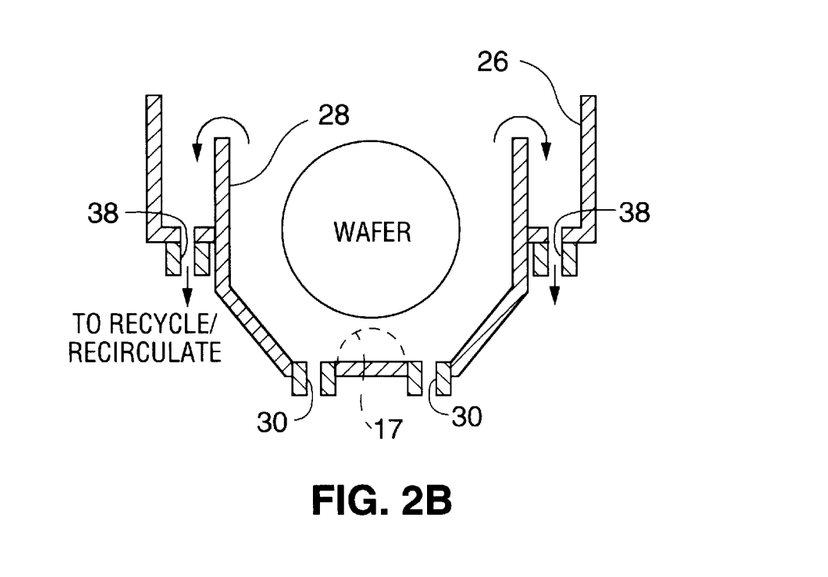
FIG. 2B is a cross-section view of one of the tanks of FIG. 2A.

Referring to FIG. 2A, the tanks 12, 14 according to the first embodiment are arranged side by side although they may also be arranged in other configurations without departing from the scope of the present invention. FIG. 2B illustrates the structure of tank 14 and it should be appreciated that tank 12 may, but need not, be similarly configured.

Referring to FIGS. 2A and 2B, tank 14 is preferably comprised of an outer tank section 26 and an inner tank section 28 disposed within the outer tank section. The walls of the outer tank section 26 extend vertically higher than the walls of the inner section 28.

At the bottom of the tank 14 are elongate fluid ports 30. During use of the system, processing fluids are pumped into the inner tank section 28 via the fluid ports 30. Processing fluids pumped into the inner tank section 28 cascade over the inner tank section walls and between the walls of the inner and outer tank sections as indicated by arrows in FIGS. 2A and 2B. The fluids leave the tank via opening 38 and flow into a waste tank or, preferably, into a recycling/recirculation system where they are treated and then re-delivered through port 30 for subsequent reuse.

One or both of the tanks 12, 14 may be provided with a lid, such as lid 15 shown in FIG. 1, which can be programmed to automatically move from a closed to an opened condition. Such a lid may be of the type found on the Model 9400 SPS or STELLARIS(tm) wet bench system provided by SCP Global Technologies, Inc. of Boise, Id. The lid minimizes vapor buildup within the tank which can cause particulate problems, minimizes cross-contamination between the tanks, and provides a further barrier against the escape of chemical fumes from the chamber 10 to the surrounding environment.

One or both of the tanks may be provided with a megasonic transducer assembly 17 of a type commonly used in wafer cleaning applications. Examples of commonly used megasonic assemblies are those provided by Verteq or PCT. During use, energy waves from the transducer 17 are transmitted into the processing or cleaning solution in the tank. The resulting agitation of the solution is sufficiently powerful to remove particles from the surfaces of the immersed objects.

An intrachamber robot 1 6 is provided for moving wafers within the chamber 10 (FIG. 1) and between the tanks 12, 14. One form of robot, shown in FIGS. 2A–6C, is designed to move the wafers in two dimensions while occupying a minimal amount of chamber space. The robot is engageable with the object or objects to be treated within the system, either directly or by means of an object carrier such as a wafer cassette.

Figure 3:
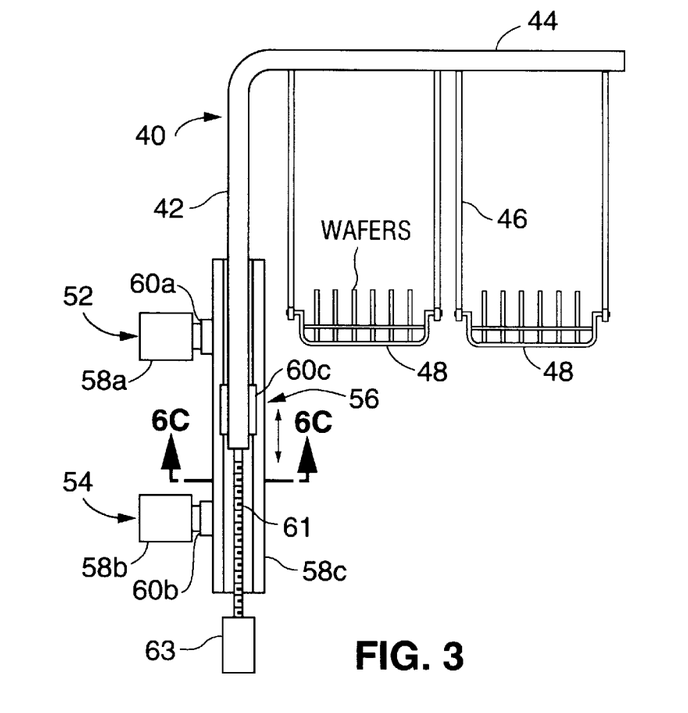
FIG. 3 is a side elevation view of the intrachamber robot of FIG. 2A.

Referring to FIGS. 1, 2A and 3, the robot 16 includes a boom 40 which preferably has a vertical section 42 disposed at one end of the tanks 12, 14 and a horizontal section 44 extending towards the tanks 12, 14. Passive end effectors 46 extend downwardly from horizontal section 44 which are configured to engage with wafer cassettes 48 (FIG. 3) or other object carrier.

Figure 5:
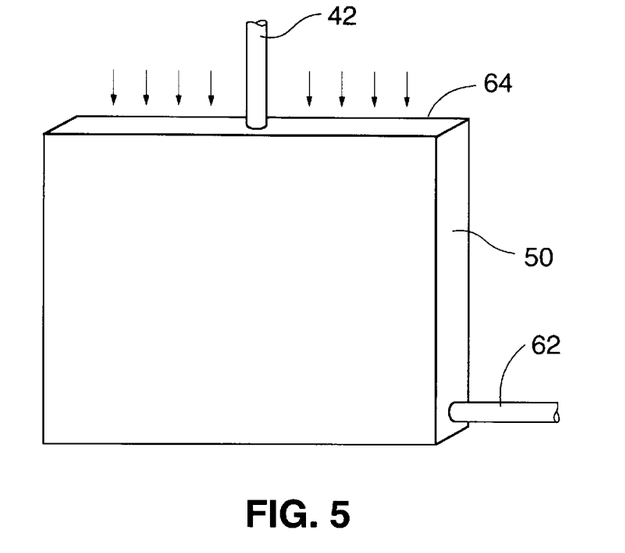
FIG. 5 is a front perspective view of an intrachamber robot housing according to the present invention.

A housing 50 (FIG. 5) encloses components of the intrachamber robot that are likely to generate particles during operation of the robot and/or be effected by the chemical fumes generated during processing. Referring to FIG. 5., intrachamber robot housing 50 is an enclosure made from a chemically resistant material. An exhaust tube 62 extends from the housing 50 and out of the chamber 10 so that particles generated by operation of the intrachamber robot 16 are substantially prevented from migrating into the processing regions of the chamber 10.

Figure 4:
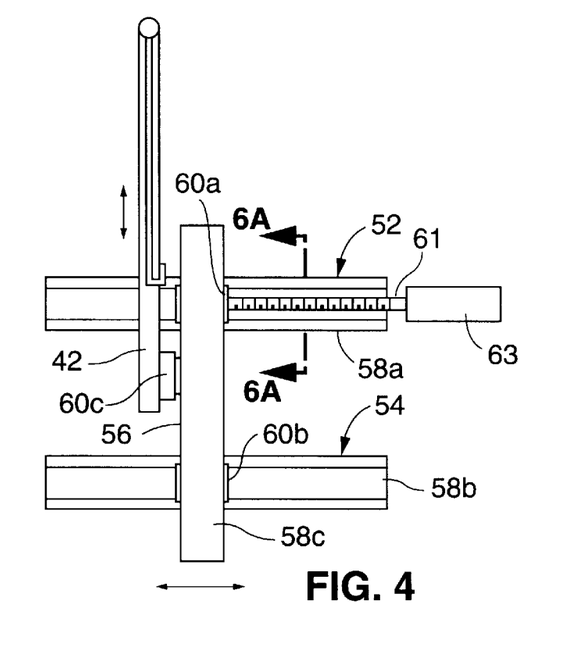
FIG. 4 is a front plan view of the intrachamber robot of FIG. 3.

The components enclosed within the housing 50 will next be described. Referring to FIGS. 3 and 4, in which the housing 50 is not shown for purposes of clarity, the intrachamber robot 16 includes three prismatic joints 52, 54, 56. Each prismatic joint is comprised of an elongate housing 58a, 58b, 58c having a "C" shaped cross-section (see the cross-section view of housing 58a shown in FIG. 6A). Each prismatic joint further includes a carriage 58, 58b, 58c that is longitudinally slidable within its corresponding housing.

The elongate housings 58a, 58b corresponding to joints 52, 54 are preferably horizontally mounted and are parallel to one another as shown. The elongate housing 58c corresponding to prismatic joint 56 is carried by the carriages corresponding to prismatic joints 52, 54 and, more specifically by support bar 59a on carriage 60a (see FIG. 6A) and by a similar bar (not shown) on carriage 60b. Horizontal movement of carriages 60a, 60b thus produces corresponding horizontal movement of elongate housing 58c.

Figure 6A:
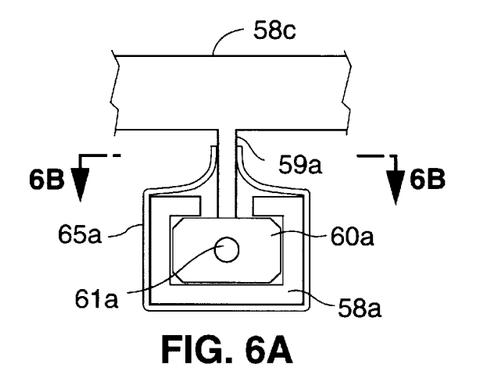
FIG. 6A is a cross-section view of the active prismatic joint of the intrachamber robot corresponding to horizontal movement of the robot, taken along the plane designated 6A—6A in FIG. 4.
Figure 6B:
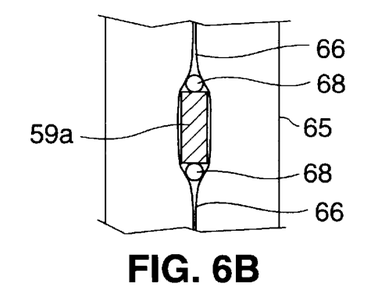
FIG. 6B is a partial cross-section view of the prismatic joint of FIG. 6A, taken along the plane designated 6B—6B in FIG. 6A.
Figure 6C:
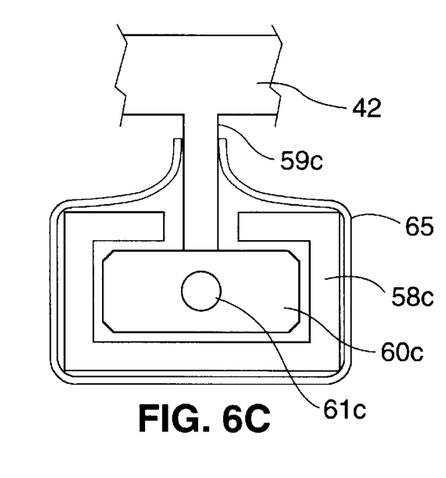
FIG. 6C is a cross-section view of the active prismatic joint of the intrachamber robot corresponding to vertical movement of the robot, taken along the plane designated 6C—6C in FIG. 3.

As shown in FIG. 6C, boom section 42 is carried by support bar 59c on carriage 60c. Boom section 42 thus moves vertically as the carriage 60c moves vertically within its elongate housing 58c and moves horizontally as the housing 58c is carried horizontally on carriages 60a, 60b.

Joints 52 and 56 are active joints, i.e. movement of the carriages 60a, 60c is effected by means of motors coupled to the carriages 60a, 60c. Joint 54 is preferably a passive joint and thus simply moves in response to movement of joint 52. Lead screws 61 are thus coupled to the carriages 60a, 60c and are driven by corresponding motors 63 mounted within housing 50.

Each prismatic joint 52, 54, 56 is enclosed within a prismatic joint jacket 65 formed of a chemically resistant yet flexible material. The jackets are not shown in FIGS. 3 and 4 for purposes of clarity, but they can be seen in FIGS. 6A through 6C. Positive pressure within the joint jackets substantially prevents chemical vapors from migrating into the working mechanisms of the working joints 52, 54, 56. Housing 50 forms an exhaust path which substantially prevents particles generated within the joints from migrating into chamber 10.

Prismatic joint jacket 65 corresponding to prismatic joint 52 is shown in FIGS. 6A and 6B. The joint jackets corresponding to prismatic joints 54 and 56 are preferably identical to the joint jacket 65. The joint jacket is an elongate enclosure positioned around elongate housing 58a. A compliant zipper seal 66 extends along the top of the jacket 65. Bar 59a extends through the zipper seal 66.

The compliant zipper seal 66 is comprised of a pair of zipper sides, each of which is made from a compliant material.

Each carriage may be additionally provided to have rods 68 such as those shown in FIG. 6B, positioned on opposite sides of the support bars (e.g. bar 59a). As shown, rods 68 extending from carriage 60a extend out from the jacket 65 through the zipper seal 66 and hold the zipper seal open in the region immediately surrounding the bar 59a. The portions of the zipper not being acted on by the rods are held together by restorative forces between them. Thus, as the rods 68 slide (together with the bar 59a) through the zipper seal 66, the zipper automatically opens in the region through which the bar is about to travel and closes in the region through which the bar has just travelled. In this way, the zipper seal permits only a very small opening around the bar 59a at any given time and thus minimizes the opening of joint jacket 65. Air pressure is supplied to the inner side of the jacket and flows out the openings in the zipper and further prevents chemical vapors from migrating into the working mechanisms of the working joints 52, 54, 56.

First Embodiment—Operation

Use of the first embodiment of the multiple stage wet process chamber 10 according to the present invention will next be described. Processes suitable for use with the first embodiment include, but are not limited to, etch/clean processes in which a sulfuric, phosphoric acid, or hydrochloric/ammonia step is followed by a rinse step.

During use, an object carrier, which may be a wafer cassette or a carrying device for other types of objects to be cleaned is loaded with the object(s) to be cleaned. For simplicity in describing the process, the terms "wafer" and "cassette" will be used but are not intended to limit the scope of the invention to wafer processing.

The sealed door 22 is opened and the loaded cassette (FIG. 3) is placed into first tank 14. The door 22 is then closed and sealed.

Next, a first chemical suitable for the process is pumped into tank 14 via opening port 30 (FIGS. 2A, 2B). After the wafers have been exposed to the first chemical for the appropriate length of time, the cassette is elevated from the tank 14 by the intrachamber robot 16, moved horizontally into position above tank 12, and lowered into tank 12 which has already been prepared with a second chemical. After the wafers have been exposed to the second chemical for the desired duration, the intrachamber robot lifts the wafers from the tank 12.

Depending on the process being carried out, the wafers may next be removed from the chamber via 22 where they are carried to other equipment for further processing, or they may be lowered into tank 14 and treated again using the same chemical or a different one.

For example, in one process according to the present invention the initial treatment in tank 14 may utilize a processing chemical to treat the wafers. In tank 12 the wafers are exposed to a "coarse rinse" of deionized water or other rinse fluid which rinses sufficient chemical from the wafers to stop the chemical process on the wafer surface. After the coarse rinse, the wafers are returned to tank 14 where they are given a "fine rinse", which removes all of the remaining chemical from the surface of the wafers. If necessary, tank 14 may first be rinsed by passing rinse fluid through the tank before re-introduction of the wafers into the tank, in order to rinse residual chemical from its walls.

Naturally, if lids such as lid 15 are provided on one or both of the tanks 12, 14, each lid may be automatically opened prior to introduction of wafers into its associated tank and closed following use of the tank.

Once the steps to be carried within the chamber 10 are completed, the chamber is unsealed and the wafers are removed from the chamber. It is important to note that the tanks 12, 14 are preferably drained of all processing fluids, or drained and then rinsed, before the chamber is unsealed to substantially prevent escape of fumes to the exterior environment.

Second Embodiment—Structure

A second embodiment of a multiple stage wet processing chamber is shown in FIGS. 7–10. In the second embodiment, processing tanks are vertically arranged relative to one another to minimize footprint requirements for the chamber.

Figure 7:
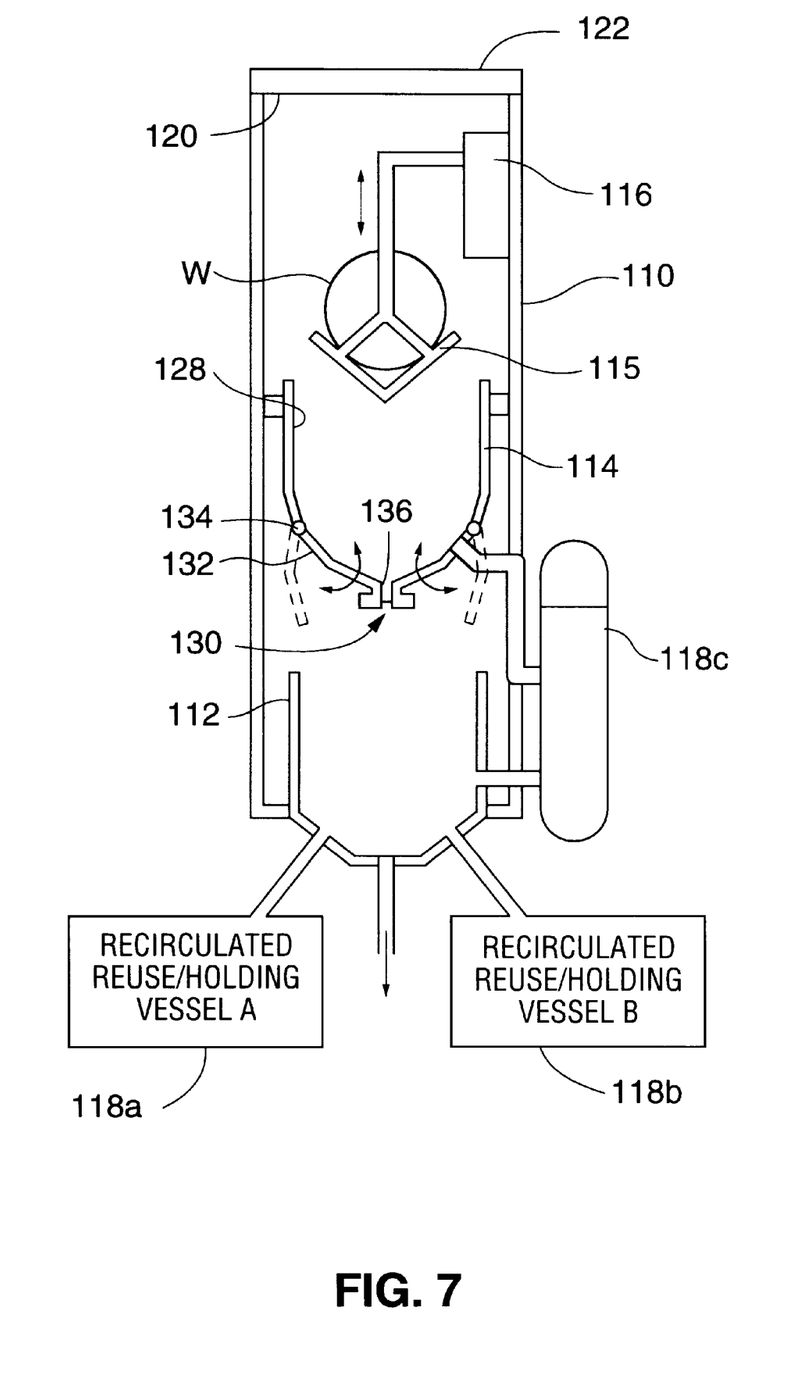
FIG. 7 is a front elevation view of a second embodiment of a multiple stage wet processing chamber according to the present invention.

Referring to FIG. 7, the second embodiment includes a chamber 1 10 having first and second processing tanks 112, 114 disposed therein with tank 114 preferably being suspended above tank 114. An intrachamber robot 116 is provided for moving wafers W or other objects to be treated within the chamber 110. The objects to be cleaned may be in an object carrier such as the wafer cassette 115 or in another object carrier suitable for the particular processing operation.

Lower tank 112 is a processing tank preferably having the type of inner and outer wall sections described with respect to tank 14 of FIG. 2 that permit processing fluids to move upwardly through the tank and cascade over the inner walls. Tank 112 is fluidly coupled to one or more supplies 118a, 118b, 118c of processing fluids. In one embodiment, sources 118a, 118b are holding vessels for chemicals which are recirculated and reused for sequential batches of wafers, and source 118c is a deionized water surge tank.

Tank 112 may or may not have a lid as described with respect to tanks of the first embodiment.

Lower tank 112 is made of a material appropriate for the chemistries which are to be utilized within the vessel. During use of the second embodiment, a number of chemicals may be sequentially used within the tank 112 as will be described below.

Upper tank 114 is positioned above first tank 112. Tank 1 14 may be a "virtual" processing tank in that it may be formed within the chamber when needed. In the second embodiment, tank 114 preferably includes side walls 128 and a trap door 130 formed in its lower section. Trap door 130 is comprised of articulating sections 132 that are pivotable relative to side walls 128 about hinges 134. Articulating sections 132 may be pivoted between the closed position shown in solid lines and the opened position shown in dashed lines. When in the opened position, the trap door permits passage of wafers or other objects through the trap door 130 and thus into or out of the lower tank 112.

Intrachamber robot 116 is designed to move the objects as needed within the chamber 110, and at the very least between the tanks 112, 114. Innumerable embodiments of robotics mechanisms suitable for the present invention (including the first and second embodiments) are well within the skill of those experienced in the field of robotics, and in fact many existing wafer processing systems utilize robotics.

For example, the intrachamber robot 16 described with respect to FIGS. 3 and 4 may be disposed within the chamber 110 of the second embodiment and used to move wafers within the chamber 110. Alternatively, the intrachamber robot 16 may be modified to eliminate prismatic joints 52 and 54, in which case it would be configured only for movement in the vertical direction in order to lift and lower the wafers within the chamber 110 and, if desired, into and out of the chamber 110. A housing similar to housing 50 is preferably utilized in order to minimize movement of particles from the prismatic joint(s) into the chamber 110 and movement of fumes into the prismatic joint(s). Jackets similar to jackets 65 (FIGS. 6A–6C) may also be utilized to provide further protection.

As with the first embodiment, chamber 110 includes an opening 120 and a sealable door 122 which seals the environment within the chamber 110 against the external environment.

Figure 8:
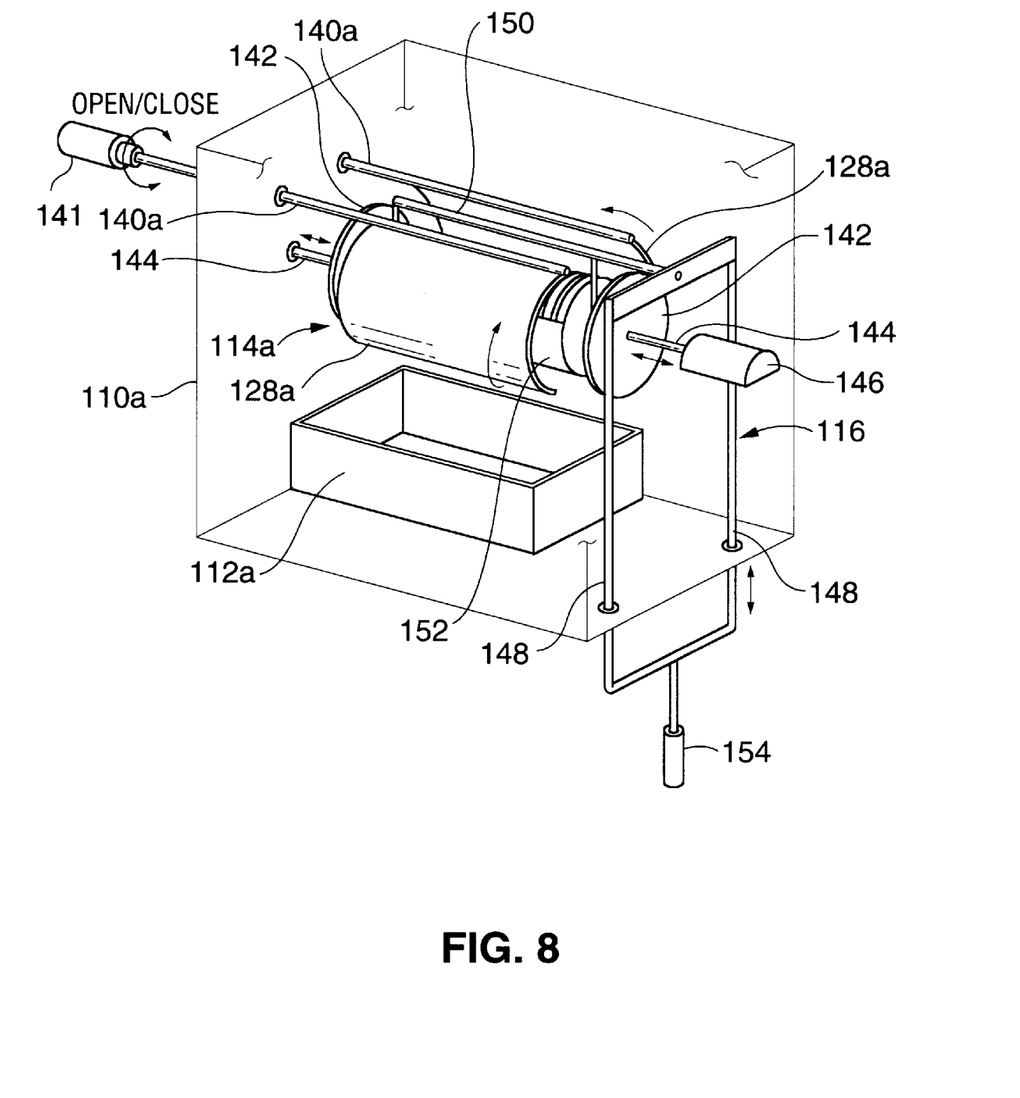
FIG. 8 is a perspective view of a first modified version of the second embodiment according to the present invention. For clarity, the chamber is shown as being transparent to allow the components within the chamber to be easily seen.

A first modified version of the second embodiment is shown in FIG. 8. The first modified version differs from the embodiment of FIG. 7 in that the upper tank 114a is comprised of a pair of tank sections 128a each mounted to a rod 140a. Actuators 141 are connected to the rods 140a to cause rotation of the rods and thus corresponding rotation of the tank sections 128a. A pair of end seals 142 is provided, each of which is mounted to a corresponding actuator rod 144 and motor 146 for producing longitudinal movement of the end seals 142. Actuators effect movement of the seals 142 between a closed condition in which the end seals 142 are moved longitudinally towards one another to seal against the tank sections 128a and to thus form the tank 114, and an opened condition in which the end seals 142 move away from each other to disengage from the tank sections 128a. The intrachamber robot 116a of the first modified second embodiment includes a pair of vertically extending rods 148 which support a longitudinally extending bar 150 and end effectors 152 carried by the bar. The end effectors 152 are designed to engage with the objects to be treated and/or to a carrier which holds the objects. A motor 154 causes vertical movement of the bar and end effectors to carry the objects between the first and second tanks 112a, 114a. Naturally, the end seals 142 and tank sections 128a are in the opened positions during vertical movement of the intrachamber robot 116a to allow the robot components and objects to pass between the tanks without obstruction.

Figure 9:
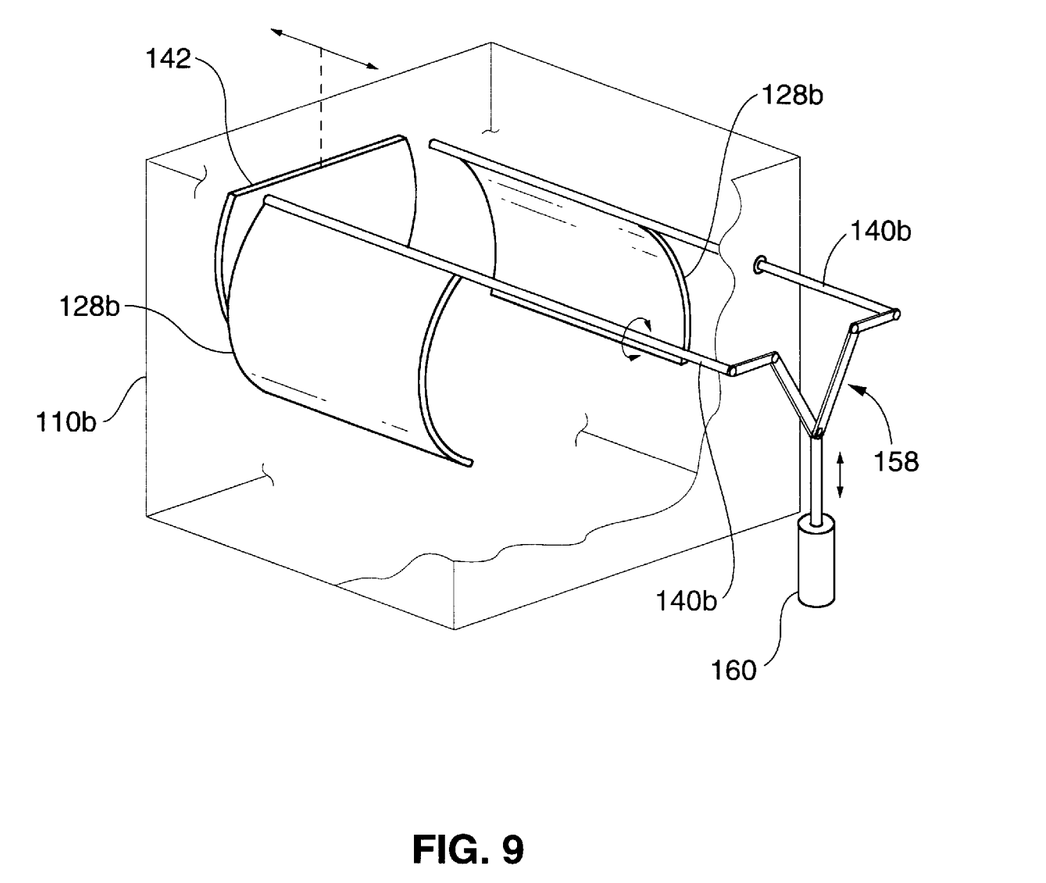
FIG. 9 is a perspective view of a second modified version of the second embodiment according to the present invention. For clarity, the chamber is shown as being transparent to allow the components within the chamber to be easily seen.

A second modified second embodiment is shown in FIG. 9. The second modified second embodiment utilizes a different actuator mechanism for creating the "virtual" tank 114b than that used with the embodiments of FIGS. 7 and 8. For clarity, only the tank 114b and its actuator mechanism are shown within the chamber 110b in FIG. 9.

As with the embodiment of FIG. 8, the embodiment of FIG. 9 includes a pair of tank sections 128b mounted on longitudinally extending rods 140b. Rotation of rods 140b to open and close the tank sections 128b is effected by linkages 158 driven by motor 160. Positioning of the end seals 142b (one shown) may be carried out as described with respect to FIG. 8.

Second Embodiment—Operation

Use of the second embodiment according to the present invention will next be described.

First, objects to be treated within the multiple stage wet processing chamber 110 (the term "wafers" will be used for simplicity) are loaded onto the intrachamber robot 116 and lowered into the chamber 110. Door 122 is closed and sealed.

Next, lower tank 112 is rapidly filled with a first processing chemical from chemical source 118a. Once the wafers are immersed in the tank 112, chemical from vessel 118a continues to flow into tank 112, but at a slower rate, causing the chemical to cascade over the tank walls (as described with respect to tank 14) and to be collected by vessel 118a for recirculation and reuse. Once the wafers have been exposed to the chemical for the required period of time, the chemical in tank 112 is quickly drained back into the vessel 118a.

Lower tank 112 is next rapidly filled with deionized water from surge vessel 118c to carry out a coarse rinse of the wafers. The DI is allowed to flow through the tank and cascade over the tank walls as needed to promote the optimum rinse. The deionized water is then rapidly drained from the tank 112.

If the process being carried out is one which requires sequential treatment by two or more chemicals, a second chemical is caused to flow into the tank 112 from second chemical source 118b and used to treat the wafers as described above. The coarse rinse process is repeated and any subsequent chemical steps are repeated in the same manner as needed for the particular surface preparation process being carried out.

For certain processes, process performance mandates quick transitions between the chemical exposure steps and the coarse rinse steps used to stop the chemical reaction. In such processes, which include etch processes in which the wafers are first immersed in an HF or BOE solution and then rinsed with deionized water or other rinse solution, it may be desirable to utilize the intrachamber robot 11 6 to control this critical interaction within the lower tank 112.

Figure 10:
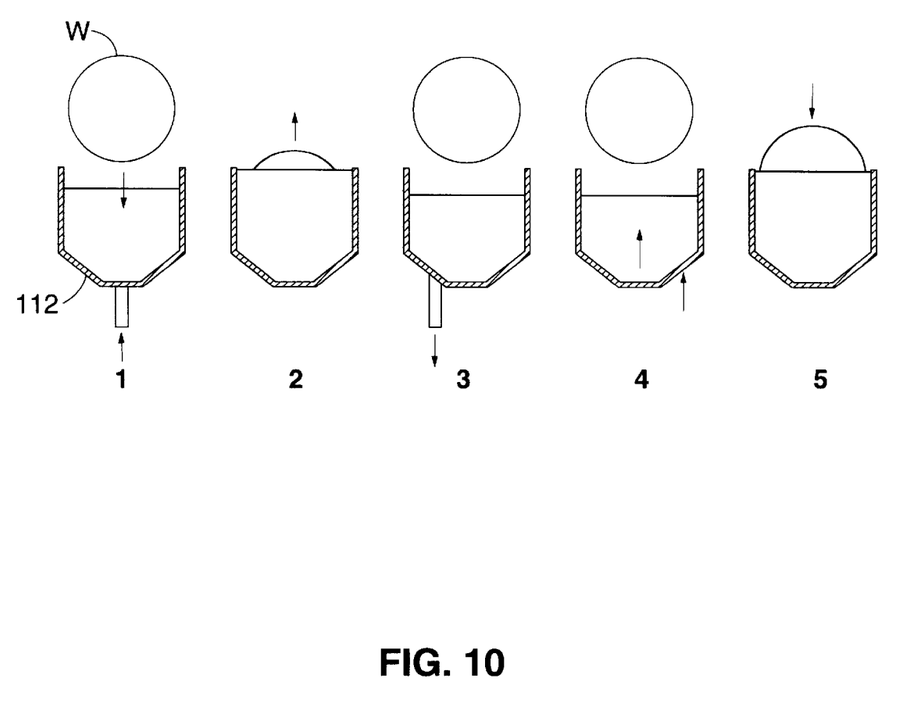
FIG. 10 is a schematic view of the chamber and lower tank of the multiple stage wet processing chamber of FIG. 7 illustrating a reaction stop feature of the process of the present invention. For clarity, the upper tank is not shown in FIG. 10.

Referring to FIG. 10, in step 1 the material is delivered to the intra-chamber robot (not shown), the tank 1 12 is rapidly filled with chemical (e.g. HF or SC-1 or rinse fluids), and the wafers are introduced into the tank 112. In step 2, at the end of the chemical process dwell time (e.g., which may be approximately 5–10 minutes for certain procedures), the material is removed from the tank 112. In step 3, with the wafers suspended above the tank 112, the chemical is rapidly drained back into the appropriate chemical source (e.g. vessel 118a). In step 4, the tank 112 is rapidly filled with DI water and in step 5, the wafers are relowered into the tank 112.

The intra-chamber robot performs all material handling operations within the chamber and is precisely controlled through parameters that provide the optimum performance. A number of performance reasons, such as etch rate uniformity and particle performance make it desirable to keep the transition time between chemical exposure and the rinse stop as short as possible. With the wafers vacated from the tank 112 via the intra-chamber robot during this transition, the DI can be introduced into the tank using an extremely high flow rate burst. This technique avoids the complex fluid dynamic issues, chemical and rinse water mixing issues associated with plug flow techniques and material breakage problems introduced by the very high rinse fluid flows.

After the wafers have been treated in tank 112, they are elevated within the chamber 110 by the intrachamber robot 116. Tank 112 is drained of processing fluids and may be rinsed using a rinse fluid. Robot 116 carries the wafers through the trap door 130 and positions them between the walls 128 of tank 114. Trap door 130 is next closed to close the bottom section of tank 114. Seals 136 seal against one another to seal the tank bottom against excessive leakage, although it is not necessary for tank 114 to be liquid tight.

With the wafers in the upper tank 114, the tank 114 is flooded with deionized water from surge vessel 118c in order to complete a fine rinse of the wafers. Any leakage of deionized water from the tank 114 serves to further rinse lower tank 112. Because the walls of tank 112 may absorb reactive chemicals during the chemical exposure steps, the fine rinse carried out in upper tank 114 eliminates the risk that such chemicals will leach out of the walls and back onto the wafers during the final rinse. Since the upper tank 114 is never directly exposed to the reactive chemicals, the desired level of purity is reached more quickly and with much less deionized water than would be possible using lower tank 112.

Once the fine rinse step is completed and processing chemicals are drained from the chamber, the chamber is unsealed and the wafers removed.

Third Embodiment

Figure 11:
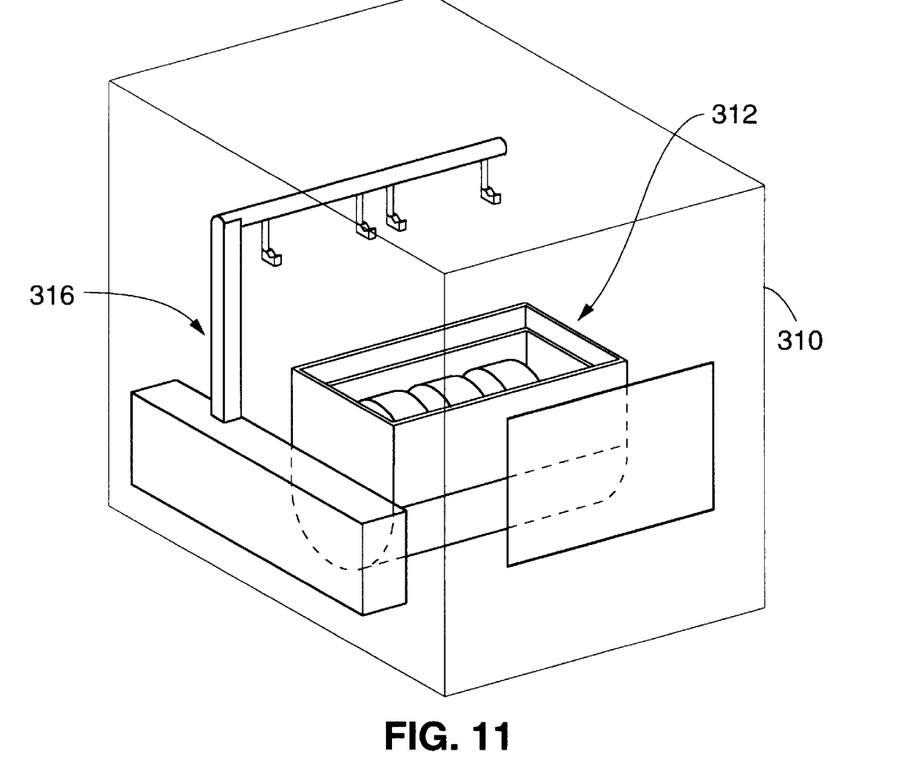
FIG. 11 is a perspective view of a third embodiment of a processing system in accordance with the present invention.

A third embodiment according to the present invention is shown in FIG. 11 and comprises a sealable processing chamber 310, a single tank 312 within the chamber, and an intrachamber robot 316 for moving objects to be treated within the chamber. The third embodiment is similar to the second, except that the upper tank 114 is eliminated.

The third embodiment may used, for example, for processes requiring critical treatment/rinse transition times as described above with respect to FIG. 10. In other words, the intrachamber robot 316 is used to lift the wafers from the treatment tank 312 between the chemical and rinse steps so that the processing fluids can be moved quickly in and out of the tank 312 without damaging the wafers.

Fourth Embodiment

Figure 12:
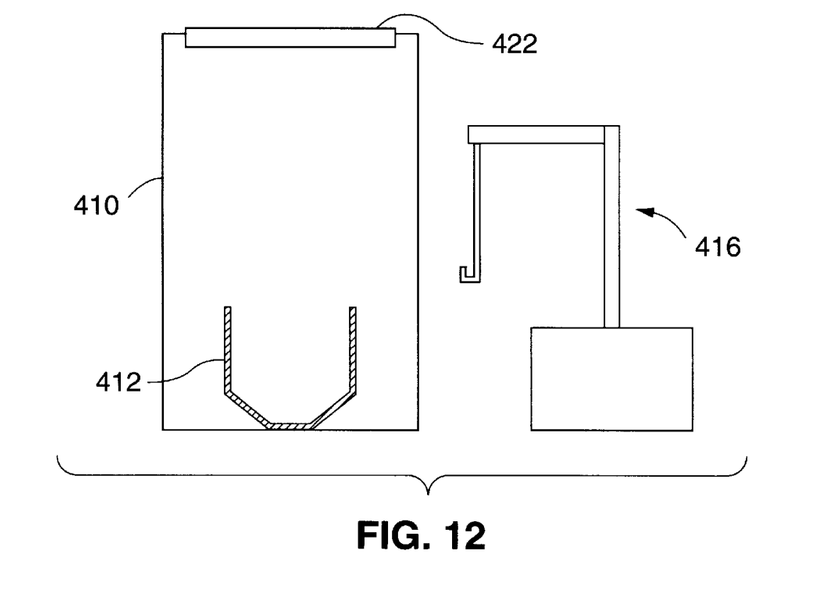
FIG. 12 is an end view of a fourth embodiment of a processing system in accordance with the present invention.

The embodiments shown herein may alternatively be provided without the intrachamber robots. In other words, movement of the wafers in and out of the tanks of the first, second and third embodiments may alternatively be carried out using external means such as robotics positioned outside of the chamber. For example, as shown in FIG. 12, a chamber 410 may be provided to have one or more tanks 412 inside, and a robot 41 6 may be positioned externally of the chamber. Tank 412 preferably includes a lid of the type described above. As with each of the previously described embodiments, the tank is fluidly coupled to a plurality of supply tanks 418 for processing fluids, including treatment and rinse fluids, that are selectively circulated through the tanks and subsequently recycled for reuse.

What is claimed is:

1. A method of performing wet processing steps on an object placed within a sealed chamber, comprising the steps of:

(a) providing a sealable chamber, a sealable processing tank within the chamber, and an intrachamber robot;

(b) placing an object to be treated within the chamber;

(c) sealing the chamber to create an interior environment within the chamber which is isolated from an exterior environment outside the chamber to prevent passage of fumes from the interior to the exterior environment;

(d) at least partially filling the processing tank with a first processing fluid;

(e) immersing the object in the first processing fluid in the tank and sealing the tank;

(f) unsealing the tank;

(g) using the intrachamber robot, removing the object from the processing tank; and (h) unsealing the chamber and removing the object from the chamber.

2. The method of claim 1, further comprising the step of draining the first processing fluid from the tank prior to unsealing the chamber.

3. The method of claim 2 wherein the draining step is performed after the object has been removed from the tank.

4. The method of claim 1 wherein the method further includes the steps of, prior to unsealing the chamber:

draining the first processing fluid from the processing tank;

at least partially filling the processing tank with a second processing fluid;

immersing the object in the second processing fluid; and using the intrachamber robot, removing the object from the second processing fluid.

5. The method of claim 4 further comprising the step of draining the second processing fluid from the tank prior to unsealing the chamber.

6. The method of claim 4 further including the step of rinsing the processing tank prior to immersing the object in the second processing fluid.

7. A method of performing wet processing steps on an object placed within a sealed chamber, comprising the steps of:

(a) providing a sealable chamber, at least two processing tanks within the chamber, and an intrachamber robot;

(b) placing at least one object to be treated within the chamber;

(c) sealing the chamber to create an interior environment within the chamber which is isolated from an exterior environment outside the chamber to substantially prevent passage of fumes from the interior to the exterior environment;

(d) at least partially filling a first one of the processing tanks with a first processing fluid;

(e) immersing the object in the first processing fluid in the first tank;

(f) at least partially filling a second one of the processing tanks with a second processing fluid;

(g) using the intrachamber robot, removing the object from the first processing tank and immersing it in the second processing fluid in the second processing tank;

(h) unsealing the chamber; and (i) removing the object from the chamber.

8. The method of claim 7 further comprising the step of draining at least one of the first and second tanks before the chamber is unsealed.

9. The method of claim 7 wherein in step (e) the object is moved into the first tank using the intrachamber robot.

10. The method of claim 7 further comprising the steps of:

draining at least one of the tanks and at least partially filling said tank with a third processing fluid;

using the intrachamber robot, moving the object into said tank to immerse the object in the third processing fluid; and using the intrachamber robot to remove the object from said tank containing the third processing fluid, wherein the unsealing step is performed at a time after the object has been removed from said tank containing the third processing fluid.

11. The method of claim 10 further comprising the step of draining the third processing fluid prior to unsealing the chamber.

12. The method of claim 10 wherein the first processing fluid is a chemical treatment fluid and wherein the second and third processing fluids are rinse fluids.

13. The method of claim 7 wherein step (a) further provides a lid for at least one of the tanks and wherein the method includes the steps of closing and opening the said one of the tanks using the lid, the closing and opening steps occurring while the chamber is sealed.

14. The method of claim 7 wherein the first and second tanks are vertically arranged relative to one another.

15. The method of claim 7 wherein:

the second tank provided in step (a) is positioned above the first tank and includes a tank bottom, an opening in the tank bottom, and tank bottom portions that are moveable between opened and closed positions to open and close the opening in the tank bottom; and the opening in the tank bottom is in the opened position during movement of the object between the first and second tanks and in the closed position closed during step (f).

16. The method of claim 7 wherein the first and second tanks are positioned in side by side relation.

17. The method of claim 7 wherein the first processing fluid is a chemical treatment fluid and wherein the second processing fluid is a rinse fluid.

18. A method of processing an object placed within a sealed chamber, comprising the steps of:

(a) providing a sealable chamber and a processing tank within the chamber;

(b) placing at least one object to be treated within the chamber;

(c) sealing the chamber to create an interior environment within the chamber which is isolated from an exterior environment outside the chamber to substantially prevent passage of fumes from the interior to the exterior environment;

(d) at least partially filling the processing tank with a first processing fluid;

(e) immersing the object in the first processing fluid in the tank;

(f) removing the object from the first processing fluid;

(g) draining the first processing fluid from the processing tank; and (h) after draining the processing tank, unsealing the chamber and removing the object from the chamber.

19. The method of claim 18 wherein step (a) further provides a robot within the chamber and wherein steps (e) and (f) are performed by the robot.

20. The method of claim 18 wherein the method further includes the steps of, after step (g):

at least partially filling the processing tank with a second processing fluid;

immersing the object in the second processing fluid;

removing the object from the second processing fluid.

21. The method of claim 20 wherein the method includes the step of draining the second processing fluid from the processing tank before unsealing the chamber and removing the object from the chamber.

22. The method of claim 18 wherein step (a) further provides a lid for the tank and wherein the method includes the steps of closing the tank with the lid after step (e) and opening the tank using the lid prior to step (f).

23. The method of claim 18 wherein step (g) is performed after the object has been removed from the first processing fluid.

\* \* \* \* \*